(12) United States Patent
Estakhri et al.

(10) Patent No.: US 8,171,203 B2
(45) Date of Patent: May 1, 2012

(54) FASTER WRITE OPERATIONS TO NONVOLATILE MEMORY USING FSINFO SECTOR MANIPULATION

(75) Inventors: Petro Estakhri, Pleasanton, CA (US); Sam Nemazie, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 387 days.

(21) Appl. No.: 10/741,129

(22) Filed: Dec. 19, 2003

(65) Prior Publication Data

US 2005/0055497 A1 Mar. 10, 2005

Related U.S. Application Data

(63) Continuation-in-part of application No. 09/620,544, filed on Jul. 21, 2000, now Pat. No. 6,978,342, which is a continuation of application No. 09/264,340, filed on Mar. 8, 1999, now Pat. No. 6,145,051, which is a continuation of application No. 08/831,266, filed on Mar. 31, 1997, now Pat. No. 5,907,856, which is a continuation-in-part of application No. 08/509,706, filed on Jul. 31, 1995, now Pat. No. 5,845,313.

(51) Int. Cl.
*G06F 12/02* (2006.01)
(52) U.S. Cl. ........ 711/103; 711/165; 711/170; 711/203; 365/185.33
(58) Field of Classification Search .................. 711/103, 711/165, 170, 203; 365/185.33
See application file for complete search history.

(56) References Cited

U.S. PATENT DOCUMENTS

| | | | |
|---|---|---|---|
| 4,099,069 A | 7/1978 | Cricchi et al. | |
| 4,130,900 A | 12/1978 | Watanabe | |
| 4,210,959 A | 7/1980 | Wozniak | 364/200 |
| 309,627 A | 1/1982 | Tabata | |
| 4,355,376 A | 10/1982 | Gould | 365/230 |
| 4,398,248 A | 8/1983 | Hsia et al. | |
| 4,405,952 A | 9/1983 | Slakmon | 360/49 |
| 4,414,627 A | 11/1983 | Nakamura | |
| 4,450,559 A | 5/1984 | Bond et al. | 371/10 |
| 4,456,971 A | 6/1984 | Fukuda et al. | 364/900 |

(Continued)

FOREIGN PATENT DOCUMENTS

AU 0 557 723 1/1987

(Continued)

OTHER PUBLICATIONS

Ali, Syed Riffat, "Implementation of Firmware on SPC Switching Systems", Oct. 1988, IEEE Journal on Selected Areas in Communications, vol. 6, No. 8, pp. 1401-1404.*

(Continued)

*Primary Examiner* — Arpan P. Savla
(74) *Attorney, Agent, or Firm* — Leffert Jay & Polglaze, P.A.

(57) ABSTRACT

An embodiment of the present invention includes a digital equipment system having a host for sending write commands to write files having sector information and having a controller device responsive to the commands for writing and updating FSInfo sector information. The controller controls a nonvolatile memory system organized into blocks, each block including a plurality of sector locations for storing sector information, a particular free block, designated for storing FSInfo sector information. Upon updating of the FSInfo sector, the updated FSInfo sector information is written to a next free sector of the dedicated block thereby avoiding moving the sectors of the particular block to another block, hence, improving system performance.

13 Claims, 3 Drawing Sheets

U.S. PATENT DOCUMENTS

| | | | |
|---|---|---|---|
| 4,468,730 A | 8/1984 | Dodd et al. | |
| 4,473,878 A | 9/1984 | Zolnowsky et al. | |
| 4,476,526 A | 10/1984 | Dodd | |
| 4,498,146 A | 2/1985 | Martinez | 364/900 |
| 4,525,839 A | 6/1985 | Nozawa et al. | 371/38 |
| 4,532,590 A | 7/1985 | Wallach et al. | |
| 4,609,833 A | 9/1986 | Gutterman | |
| 4,616,311 A | 10/1986 | Sato | 364/200 |
| 4,654,847 A | 3/1987 | Dutton | 371/10 |
| 4,710,871 A | 12/1987 | Belknap et al. | 364/200 |
| 4,746,998 A | 5/1988 | Robinson et al. | 360/72.1 |
| 4,748,320 A | 5/1988 | Yorimoto et al. | 235/492 |
| 4,757,474 A | 7/1988 | Fukushi et al. | 365/189 |
| 4,774,700 A | 9/1988 | Satoh et al. | 369/54 |
| 4,780,855 A | 10/1988 | Iida et al. | |
| 4,788,665 A | 11/1988 | Fukuda et al. | |
| 4,797,543 A | 1/1989 | Watanabe | |
| 4,800,520 A | 1/1989 | Iijima | 364/900 |
| 4,829,169 A | 5/1989 | Watanabe | |
| 4,843,224 A | 6/1989 | Ohta et al. | |
| 4,896,262 A | 1/1990 | Wayama et al. | 364/200 |
| 4,914,529 A | 4/1990 | Bonke | 360/48 |
| 4,920,518 A | 4/1990 | Nakamura et al. | 365/228 |
| 4,924,331 A | 5/1990 | Robinson et al. | 360/72.1 |
| 4,943,745 A | 7/1990 | Watanabe et al. | |
| 4,953,122 A | 8/1990 | Williams | 364/900 |
| 4,970,642 A | 11/1990 | Yamamura | |
| 4,970,727 A | 11/1990 | Miyawaki et al. | |
| 5,070,474 A | 12/1991 | Tuma et al. | 395/500 |
| 5,093,785 A | 3/1992 | Iijima | |
| 5,168,465 A | 12/1992 | Harari | 257/320 |
| 5,198,380 A | 3/1993 | Harari | 437/43 |
| 5,200,959 A | 4/1993 | Gross et al. | 371/21.6 |
| 5,218,695 A | 6/1993 | Noveck et al. | |
| 5,220,518 A | 6/1993 | Haq | |
| 5,226,168 A | 7/1993 | Kobayashi et al. | 395/800 |
| 5,227,714 A | 7/1993 | Lou | |
| 5,253,351 A | 10/1993 | Yamamoto et al. | |
| 5,267,218 A | 11/1993 | Elbert | |
| 5,268,318 A | 12/1993 | Harari | 437/43 |
| 5,268,870 A | 12/1993 | Harari | 365/218 |
| 5,270,979 A | 12/1993 | Harari et al. | 365/218 |
| 5,293,560 A | 3/1994 | Harari | 365/185 |
| 5,297,148 A | 3/1994 | Harari et al. | 371/10.2 |
| 5,303,198 A | 4/1994 | Adachi et al. | 365/218 |
| 5,305,276 A | 4/1994 | Uenoyama | |
| 5,305,278 A | 4/1994 | Inoue | |
| 5,315,541 A | 5/1994 | Harari et al. | 365/63 |
| 5,315,558 A | 5/1994 | Hag | |
| 5,329,491 A | 7/1994 | Brown et al. | |
| 5,337,275 A | 8/1994 | Garner | 365/189.01 |
| 5,341,330 A | 8/1994 | Wells et al. | 365/185 |
| 5,341,339 A | 8/1994 | Wells | 365/218 |
| 5,341,341 A | 8/1994 | Fukuzo | |
| 5,353,256 A | 10/1994 | Fandrich et al. | 365/230.03 |
| 5,357,475 A | 10/1994 | Hasbun et al. | 365/218 |
| 5,359,569 A | 10/1994 | Fujita et al. | |
| 5,365,127 A | 11/1994 | Manley | |
| 5,369,615 A | 11/1994 | Harari et al. | 365/218 |
| 5,371,702 A | 12/1994 | Nakai et al. | |
| 5,381,539 A | 1/1995 | Yanai et al. | |
| 5,382,839 A | 1/1995 | Shinohara | |
| 5,384,743 A | 1/1995 | Rouy | |
| 5,388,083 A | 2/1995 | Assar et al. | 365/218 |
| 5,396,468 A | 3/1995 | Harari et al. | 365/218 |
| 5,404,485 A | 4/1995 | Ban | |
| 5,406,527 A | 4/1995 | Honma | |
| 5,412,612 A * | 5/1995 | Oyama | 365/228 |
| 5,418,752 A | 5/1995 | Harari et al. | 365/218 |
| 5,422,842 A | 6/1995 | Cernea et al. | 365/185 |
| 5,422,856 A | 6/1995 | Sasaki et al. | |
| 5,428,621 A | 6/1995 | Mehrotra et al. | 371/21.4 |
| 430,682 A | 7/1995 | Ishikawa et al. | |
| 5,430,859 A | 7/1995 | Norman et al. | 395/425 |
| 5,431,330 A | 7/1995 | Wieres | |
| 5,434,825 A | 7/1995 | Harari | 365/185 |
| 5,438,573 A | 8/1995 | Mangan et al. | 371/103 |
| 465,338 A | 11/1995 | Clay | |
| 5,465,235 A | 11/1995 | Miyamoto | |
| 5,471,478 A | 11/1995 | Mangan et al. | 371/103 |
| 5,473,765 A | 12/1995 | Gibbons et al. | |
| 5,479,638 A | 12/1995 | Assar et al. | 395/430 |
| 5,485,595 A | 1/1996 | Assar et al. | 395/430 |
| 5,490,117 A | 2/1996 | Oda et al. | |
| 5,495,442 A | 2/1996 | Cernea et al. | 365/185.03 |
| 5,504,760 A | 4/1996 | Harari et al. | 371/40.1 |
| 5,508,971 A | 4/1996 | Cernea et al. | 365/185.23 |
| 5,513,138 A | 4/1996 | Manabe et al. | |
| 5,515,333 A | 5/1996 | Fujita et al. | |
| 5,519,847 A | 5/1996 | Fandrich et al. | |
| 5,523,980 A | 6/1996 | Sakui et al. | |
| 5,524,230 A | 6/1996 | Sakaue et al. | 395/430 |
| 5,530,673 A | 6/1996 | Tobita et al. | |
| 5,530,828 A | 6/1996 | Kaki et al. | |
| 5,530,938 A | 6/1996 | Akasaka et al. | |
| 5,532,962 A | 7/1996 | Auclair et al. | 365/201 |
| 5,532,964 A | 7/1996 | Cernea et al. | 365/189.09 |
| 5,534,456 A | 7/1996 | Yuan et al. | 437/43 |
| 5,535,328 A | 7/1996 | Harari et al. | 395/182.05 |
| 5,541,551 A | 7/1996 | Brehner et al. | |
| 5,544,118 A | 8/1996 | Harari | 365/218 |
| 5,544,356 A | 8/1996 | Robinson et al. | 395/600 |
| 5,552,698 A | 9/1996 | Tai et al. | |
| 5,553,261 A * | 9/1996 | Hasbun et al. | 711/103 |
| 5,554,553 A | 9/1996 | Harari | 437/43 |
| 5,563,825 A | 10/1996 | Cernea et al. | 365/185.18 |
| 5,566,314 A | 10/1996 | DeMarco et al. | 395/430 |
| 5,568,439 A | 10/1996 | Harari | 365/218 |
| 5,572,466 A | 11/1996 | Sukegawa | |
| 5,579,502 A | 11/1996 | Konishi et al. | |
| 5,581,723 A | 12/1996 | Hasbun et al. | |
| 5,583,812 A | 12/1996 | Harari | 365/185.33 |
| 5,592,415 A | 1/1997 | Kato et al. | |
| 5,592,420 A | 1/1997 | Cernea et al. | 365/185.18 |
| 5,596,526 A | 1/1997 | Assar et al. | |
| 5,598,370 A | 1/1997 | Niisima et al. | |
| 5,602,987 A | 2/1997 | Harari et al. | |
| 5,603,001 A | 2/1997 | Sukegawa et al. | |
| 5,606,660 A | 2/1997 | Estakhri et al. | |
| 5,611,067 A | 3/1997 | Okamoto et al. | |
| 5,640,528 A | 6/1997 | Harney et al. | |
| 5,642,312 A | 6/1997 | Harari | 365/185.33 |
| 5,648,929 A | 7/1997 | Miyamoto | |
| 5,663,901 A | 9/1997 | Wallace et al. | 365/52 |
| 5,693,570 A | 12/1997 | Cernea et al. | 437/205 |
| 5,712,819 A | 1/1998 | Harari | 365/185.29 |
| 5,719,808 A | 2/1998 | Harari et al. | 365/185.33 |
| 723,990 A | 3/1998 | Roohparvar | |
| 5,734,567 A | 3/1998 | Griffiths et al. | |
| 5,745,418 A | 4/1998 | Ma et al. | |
| 758,100 A | 5/1998 | Odisho | |
| 5,754,567 A | 5/1998 | Norman | |
| 5,757,712 A | 5/1998 | Nagel et al. | |
| 768,195 A | 6/1998 | Nakamura et al. | |
| 5,761,117 A | 6/1998 | Uchino et al. | |
| 5,768,190 A | 6/1998 | Tanaka et al. | |
| 5,773,901 A | 6/1998 | Kanter | |
| 5,778,418 A | 7/1998 | Auclair et al. | 711/101 |
| 5,781,478 A | 7/1998 | Takeeuchi et al. | |
| 5,787,445 A | 7/1998 | Daberko | |
| 5,787,484 A | 7/1998 | Norman | |
| RE35,881 E | 8/1998 | Barrett et al. | |
| 5,799,168 A | 8/1998 | Ban | |
| 809,515 A | 9/1998 | Kaki et al. | |
| 5,802,551 A | 9/1998 | Komatsu et al. | |
| 5,809,558 A | 9/1998 | Matthews et al. | |
| 5,809,560 A | 9/1998 | Schneider | |
| 5,818,350 A | 10/1998 | Estakhri et al. | |
| 5,818,781 A | 10/1998 | Estakhri et al. | |
| 5,822,245 A | 10/1998 | Gupta et al. | |
| 5,822,252 A | 10/1998 | Lee et al. | |
| 5,822,781 A * | 10/1998 | Wells et al. | 711/171 |
| 5,831,929 A | 11/1998 | Manning | |
| 5,835,935 A * | 11/1998 | Estakhri et al. | 711/103 |
| 5,838,614 A | 11/1998 | Estakhri et al. | |
| 5,845,313 A | 12/1998 | Estakhri et al. | |
| 5,847,552 A | 12/1998 | Brown | |

| | | | |
|---|---|---|---|
| 5,860,083 A * | 1/1999 | Sukegawa | 711/103 |
| 5,860,124 A | 1/1999 | Matthews et al. | |
| 5,862,099 A | 1/1999 | Gannage et al. | |
| 5,890,192 A | 3/1999 | Lee et al. | |
| 5,901,086 A | 5/1999 | Wang et al. | |
| 5,907,856 A | 5/1999 | Estakhri et al. | |
| 5,909,586 A | 6/1999 | Anderson | |
| 5,920,884 A | 7/1999 | Jennings, III et al. | |
| 5,924,113 A | 7/1999 | Estakhri et al. | |
| 5,928,370 A | 7/1999 | Asnaashari | |
| 5,930,815 A | 7/1999 | Estakhri et al. | |
| 5,933,368 A | 8/1999 | Ma et al. | |
| 5,933,846 A | 8/1999 | Endo | |
| 5,936,971 A | 8/1999 | Harari et al. | |
| 5,937,425 A | 8/1999 | Ban | |
| 5,953,737 A | 9/1999 | Estakhri et al. | |
| 5,956,473 A | 9/1999 | Ma et al. | |
| 5,959,926 A | 9/1999 | Jones et al. | |
| 5,966,727 A | 10/1999 | Nishino et al. | |
| 5,986,933 A | 11/1999 | Takeuchi et al. | |
| 5,987,563 A | 11/1999 | Itoh et al. | |
| 5,987,573 A | 11/1999 | Hiraka | |
| 5,991,849 A | 11/1999 | Yamada et al. | |
| 6,000,006 A * | 12/1999 | Bruce et al. | 711/103 |
| 6,011,322 A | 1/2000 | Hiraka | |
| 6,011,323 A | 1/2000 | Camp | |
| 6,018,265 A | 1/2000 | Keshtbod | |
| 6,021,408 A | 2/2000 | Ledain et al. | |
| 6,026,020 A | 2/2000 | Matsubara et al. | |
| 6,026,027 A | 2/2000 | Terrell, II et al. | |
| 6,034,897 A | 3/2000 | Estakhri et al. | |
| 6,035,357 A | 3/2000 | Sakaki | |
| 6,040,997 A | 3/2000 | Estakhri | |
| 6,041,001 A | 3/2000 | Estakhri | |
| 6,047,352 A | 4/2000 | Lakhani et al. | |
| 6,055,184 A | 4/2000 | Acharya et al. | |
| 6,055,188 A | 4/2000 | Takeuchi et al. | |
| 6,069,827 A | 5/2000 | Sinclair | |
| 6,072,796 A | 6/2000 | Christensen et al. | |
| 6,076,137 A | 6/2000 | Asnaashari | |
| 6,081,447 A | 6/2000 | Lofgren et al. | |
| 6,081,878 A | 6/2000 | Estakhri et al. | |
| 6,084,483 A | 7/2000 | Keshtbod | |
| 6,097,666 A | 8/2000 | Sakui et al. | |
| 6,115,785 A | 9/2000 | Estakhri et al. | |
| 6,122,195 A | 9/2000 | Estakhri et al. | |
| 6,125,424 A | 9/2000 | Komatsu et al. | |
| 6,125,435 A | 9/2000 | Estakhri et al. | |
| 6,128,695 A | 10/2000 | Estakhri et al. | |
| 6,134,145 A | 10/2000 | Wong | |
| 6,134,151 A | 10/2000 | Estakhri et al. | |
| 6,141,249 A | 10/2000 | Estakhri et al. | |
| 6,145,051 A | 11/2000 | Estakhri et al. | |
| 6,151,247 A | 11/2000 | Estakhri et al. | |
| 6,172,906 B1 | 1/2001 | Estakhri et al. | |
| 6,173,362 B1 | 1/2001 | Yoda | |
| 6,181,118 B1 | 1/2001 | Meehan et al. | |
| 6,182,162 B1 | 1/2001 | Estakhri et al. | |
| 6,202,138 B1 | 3/2001 | Estakhri et al. | |
| 6,222,762 B1 * | 4/2001 | Guterman et al. | 365/185.03 |
| 6,223,308 B1 | 4/2001 | Estakhri et al. | |
| 6,226,708 B1 | 5/2001 | McGoldrick et al. | |
| 6,230,234 B1 | 5/2001 | Estakhri et al. | |
| 6,262,918 B1 | 7/2001 | Estakhri et al. | |
| 6,272,610 B1 | 8/2001 | Katayama et al. | |
| 6,275,436 B1 | 8/2001 | Tobita et al. | |
| 6,279,069 B1 | 8/2001 | Robinson et al. | |
| 6,279,114 B1 | 8/2001 | Toombs et al. | |
| 6,282,605 B1 * | 8/2001 | Moore | 711/103 |
| 6,285,607 B1 | 9/2001 | Sinclair | |
| 6,327,639 B1 | 12/2001 | Asnaashari | |
| 6,345,367 B1 | 2/2002 | Sinclair | |
| 6,374,337 B1 | 4/2002 | Estakhri | |
| 6,385,667 B1 | 5/2002 | Estakhri et al. | |
| 6,393,513 B2 | 5/2002 | Estakhri et al. | |
| 6,397,314 B1 | 5/2002 | Estakhri et al. | |
| 6,411,546 B1 | 6/2002 | Estakhri et al. | |
| 6,426,893 B1 * | 7/2002 | Conley et al. | 365/185.11 |
| 6,467,021 B1 | 10/2002 | Sinclair | |
| 6,490,649 B2 | 12/2002 | Sinclair | |
| 6,567,307 B1 | 5/2003 | Estakhri | |
| 6,578,127 B1 | 6/2003 | Sinclair | |
| 6,587,382 B1 | 7/2003 | Estakhri et al. | |
| 6,711,059 B2 | 3/2004 | Sinclair et al. | |
| 6,721,819 B2 | 4/2004 | Estakhri et al. | |
| 6,721,843 B1 | 4/2004 | Estakhri | |
| 6,725,321 B1 | 4/2004 | Sinclair et al. | |
| 6,728,851 B1 | 4/2004 | Estakhri et al. | |
| 6,751,155 B2 | 6/2004 | Gorobets | |
| 6,757,800 B1 | 6/2004 | Estakhri et al. | |
| 6,772,274 B1 * | 8/2004 | Estakhri | 711/103 |
| 6,813,678 B1 | 11/2004 | Sinclair et al. | |
| 6,898,662 B2 | 5/2005 | Gorobets | |
| 6,901,499 B2 * | 5/2005 | Aasheim et al. | 711/205 |
| 6,912,618 B2 | 6/2005 | Estakhri et al. | |
| 6,950,918 B1 | 9/2005 | Estakhri | |
| 6,957,295 B1 | 10/2005 | Estakhri | |
| 6,973,519 B1 | 12/2005 | Estakhri et al. | |
| 6,978,342 B1 | 12/2005 | Estakhri et al. | |
| 7,000,064 B2 | 2/2006 | Payne et al. | |
| 7,085,879 B2 * | 8/2006 | Aasheim et al. | 711/103 |
| 2003/0033471 A1 | 2/2003 | Lin et al. | |
| 2003/0046482 A1 | 3/2003 | Venkiteswaran | |
| 2003/0135688 A1 | 7/2003 | Tai et al. | |
| 2003/0163630 A1 * | 8/2003 | Aasheim et al. | 711/103 |
| 2003/0163631 A1 * | 8/2003 | Aasheim et al. | 711/103 |
| 2003/0163633 A1 * | 8/2003 | Aasheim et al. | 711/103 |
| 2004/0083335 A1 * | 4/2004 | Gonzalez et al. | 711/103 |

FOREIGN PATENT DOCUMENTS

| | | |
|---|---|---|
| EP | 0 220 718 A2 | 5/1987 |
| EP | 0 243 503 A1 | 11/1987 |
| EP | 0 392 895 A2 | 10/1990 |
| EP | 0 424 191 A2 | 4/1991 |
| EP | 0 489 204 A1 | 6/1992 |
| EP | 0 522 780 A2 | 1/1993 |
| EP | 0 522 780 B1 | 1/1993 |
| EP | 0 544 252 A2 | 6/1993 |
| EP | 0 613 151 A2 | 8/1994 |
| EP | 0 617 363 A2 | 9/1994 |
| EP | 0 619 541 A2 | 10/1994 |
| EP | 0 663 636 A1 | 7/1995 |
| EP | 0 686 976 A2 | 12/1995 |
| EP | 0 897 579 B1 | 7/2000 |
| EP | 0 891 580 B1 | 11/2000 |
| EP | 0 896 699 B1 | 11/2000 |
| EP | 0 852 766 B1 | 5/2001 |
| EP | 0 852 765 B1 | 9/2001 |
| EP | 0 722 585 B1 | 5/2002 |
| EP | 0 910 826 B1 | 6/2002 |
| EP | 0 691 008 B1 | 11/2002 |
| EP | 0 861 468 B1 | 4/2003 |
| EP | 0 978 040 B1 | 5/2004 |
| EP | 1 157 328 B1 | 5/2005 |
| EP | 1 548 599 A2 | 6/2005 |
| FR | 93 01908 | 8/1993 |
| GB | 2 251 323 A | 7/1992 |
| GB | 2 291 990 A | 2/1996 |
| GB | 2 291 991 A | 7/1996 |
| GB | 2 291 991 B | 7/1996 |
| GB | 2 297 637 A | 7/1996 |
| GB | 2 304 428 A | 3/1997 |
| GB | 2 351 822 B | 1/2003 |
| GB | 2 384 337 A | 7/2003 |
| GB | 2 382 883 A | 10/2005 |
| GB | 2 384 338 B | 11/2005 |
| GB | 2 384 072 B | 12/2005 |
| GB | 2 411 499 B | 2/2006 |
| IS | 117881 | 5/2003 |
| JP | 58-215794 A | 12/1983 |
| JP | 58-215795 A | 12/1983 |
| JP | 59-45695 A | 3/1984 |
| JP | 59-162695 A | 9/1984 |
| JP | 60-212900 A | 10/1985 |
| JP | 61-96598 A | 5/1986 |
| JP | 62-283496 A | 12/1987 |
| JP | 62-283497 A | 12/1987 |
| JP | 63-183700 A | 7/1988 |

| | | |
|---|---|---|
| JP | 1-138694 A | 5/1989 |
| JP | 3-228377 A | 10/1991 |
| JP | 4-57295 A | 2/1992 |
| JP | 4-254994 A | 9/1992 |
| JP | 4-268284 A | 9/1992 |
| JP | 4-278297 A | 10/1992 |
| JP | 4-332999 A | 11/1992 |
| JP | 5-128877 A | 5/1993 |
| JP | 5-282883 A | 10/1993 |
| JP | 6-36578 A | 2/1994 |
| JP | 6-124175 A | 5/1994 |
| JP | 6-124231 A | 5/1994 |
| JP | 6-131889 A | 5/1994 |
| JP | 6-132747 A | 5/1994 |
| JP | 6-149395 A | 5/1994 |
| JP | 6-266596 A | 9/1994 |
| JP | 7-93499 A | 4/1995 |
| JP | 7-311708 A | 11/1995 |
| JP | 8-18018 A | 1/1996 |
| JP | 8-69696 A | 3/1996 |
| JP | 9-147581 A | 6/1997 |
| SU | 1388877 A1 | 4/1988 |
| SU | 1408439 A1 | 7/1988 |
| SU | 1515164 A1 | 10/1989 |
| SU | 1541619 A1 | 2/1990 |
| SU | 1573458 A2 | 6/1990 |
| SU | 1686449 A2 | 10/1991 |
| WO | WO 84/00628 | 2/1984 |
| WO | WO 94/20906 A1 | 9/1994 |

OTHER PUBLICATIONS

IEEE 100: The Authoritative Dictionary of IEEE Standards Terms, Dec. 2000, IEEE Press, Seventh Edition, pp. 685.*
Science Forum, Inc., Flash Memory Symposium '95,symposium,1995, 13 pgs.; Hongo,Bunkyo-ku,Tokyo.
Ross S. Finlayson and David R. Cheriton, An Extended File Service Exploiting Write-Once Storage, article, 1987, 10 pgs. ACM.
Jason Gait, The Optical File Cabinet: A Random-Access File System for Write-Once Optical Disks, article, Jun. 1988, 12 pgs., Beaverton, Oregon.
Henry G. Baker, Memory Management, book, 1995, 19 pgs., Springer-Verlag Berlin Heidelberg, Germany.
Sape J. Mullender and Andrew S. Tanenbaum, A Distributed File Service Based on Optimistic Concurrency Control, article, 1985, 12 pgs., ACM.
Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers., 2 pgs.
Hiroshi Nakamura, Junichi Miyamoto, Kenichi Imamiya, Yoshihisa Iwata, Yoshihisa Sugiura and Hideko Oodaira, A Novel Sensing Scheme with On-Chip Page Copy for Flexible Voltage NAND Flash Memories, article, Jun. 1996, 9 pgs.., vol. E79-C, No. 6.
Takaaki Nozaki, Toshiaki Tanaka, Yoshiro Kijiya, Eita Kinoshita, Tatsuo Tsuchiya and Yutaka Hayashi, A 1-Mb EEPROM with MONOS Memory Cell for Semiconductor Disk Application, article, 1991, 5 pgs., Journal of Soldi—State Circuits, vol. 26, No. 4.
Kai Hwang and Faye A. Briggs, Computer Architecture and Parallel Processing, book, 1984, McGraw-Hill, Inc., 2 pgs., US.
Walter Lahti and Dean McCarron, State of the Art: Magnetic VS. Optical Store Data in a Flash, article, 1990, 7 pgs., vol. 15, No. 12, McGraw-Hill, Inc., US.
Ron Wilson, Integrated Circuits: 1-Mbit flash memories seek their role in system design, article, Mar. 1, 1989, 2 pgs., No. 6, Tulsa, OK.
S. Mehroura, J.H. Yuan, R.A. Cemea, W.Y. Chien, D.C. Guteman, G. Samachisa, R.D. Noman, M. Mofidi, W.Lee, Y. Fong. A. Mihnea, E. Hann, R.W. Gregor, E.P. Eberhardt, J.R. Radosevich, K.R. Stiles, R.A. Kohler, C.W. Leung, and T.J. Mulrooney, Serial 9Mb F EEPROM for Solid State Disk Applications, symposium, 1992, 2 pgs., Mountain View, CA.
Steven H. Leibson, Nonvolatile, In-circuit-reprogrammable memories, article, Jan. 3, 1991, 12 pgs., EDN, Circle No. 12.
Ramon Caceres, Fred Douglis, Kai Li and Brian Marsh, Operationg System Implications of Solid-State Mobile Computers, article, 7 pgs., Oct. 1993, Workshop on Workstation Opening Systems.
Michael Wu and Wily Zwaenepoel, A Non-Volatile, Main Memory Storage System, 12 pgs., 1994, ACM, San Jose, CA USA.
Dave Bursky, Innovative flash memories match DRAM densities: available with a choice of features, flash memories are finding homes in many systems (includes related articles on the origins of flash, and on the differences between NAND and NOR flash memories), article, May 16, 1994, 9 pgs., Electronic Design, v.42, n.10, The Gate Group.
Anthony Cataldo, New flash enhancements up ante. (Intel's 28F400BV-120 and 28F004BV-120, Atmel's AT29BV010 and AT29BV020, and Samsung Semiconductor's KM29V32000 "flash* memory" devices)(Product Announcement), article, Mar. 13, 1995, 4 pgs., Electronic News, v.41, n.2056, The Gale Group.
Sam Weber, "Flash* modules" portability, reusability, small size valued for a host of APPs-Consumer formats flocking to "flash", article, Jul. 22, 1996, 9 pgs., Electronic Engineering Times, n.911, CMP Media.
Toshiba, MOS Memory (Non-Volatile), 1995, Data Book.
Stan Baker, But Integration Calls for Hardware, Software Changes: Flash: designers face the dawn of a new memory age, article, Sep. 12, 2003, 5 pgs., Electronic Engineering Times, 1990, N.619, 41, CMP Media.
Toshiba, Toshiba MOS Digital Integrated Circuit Silicon Gate CMOS, (TC58NS512DC) Mar. 21, 2001, 43 pgs., Data Book.
Toshiba Corporation, SMIL (Smartmedia Interface Library) Hardware Edition Version 1.00, Jul. 1, 2000, 36 pgs., Data Book.
Toshiba, Toshiba MOS Digital Integrated Circuit Silicon Gate, (TC58512FT), Mar. 5, 2001, 43 pgs., Data Book.
Toshiba, Toshiba MOS Digital Integrated Circuit Silicon Gate, (TC58DVM92A1FT00), Jan. 10, 2003, 44 pgs., Data Book.
Toshiba, Toshiba MOS Digital Integrated Circuit Silicon Gate, (TC56DVG02A1FT00), Jan. 10, 2003, 44 pgs., Data Book.
Toshiba, Toshiba MOS Digital Integrated Circuit Silicon Gate, (TH58100FT), Mar. 5, 2001, 43 pgs., Data Book.
35Nonvolatile Memory Technology Review, A Time of Change, Proceedings 1993 Conference, Jun. 22-24, 1993, Linthicum Heights, MD USA.
Toshiba Corporation, SMIL (Smartmedia Interface Library) Software Edition Version 1.00, Jul. 1, 2000, 136 pgs., Data Book.
Toshiba, MOS Memory (Non-Volatile), 1996, 279 pgs., Data Book.
Dan Auclair Optimal Solid State Disk Architecure For Portable Computers, symposium, Jul. 9, 1991, 7 pgs., SunDisk Corporation.
Book—*Computer Architecture and Parallel Processing*, Kai Hwang & Faye A. Briggs, McGraw-Hill Book Co., © 1984, p. 64.
Magazine—"State of the Art: Magnetic VS. Optical Store Data in a Flash", by Walter Lahti and Dean McCarron, Byte magazine dated Nov. 1, 1990, 311, vol. 15, No. 12.
Magazine—Technology Updates, Integrated Circuits, "1-Mbit flash memories seek their role in system design", Ron Wilson, Senior Editor, Computer Design magazine 28 Mar. 1, 1989, No. 5, Tulsa OK. US, pp. 30 and 32.
1992 Symposium of VLSI Circuits Digest of Technical Papers, "EEPROM for Solid State Disk Applications", S. Mehoura et al., SunDisk Corporation, Santa Clara, CA. R.W. Gregor et al., AT&T Bell Laboratories, Allentown, PA. pp. 24 and 25.

* cited by examiner

FASTER WRITE OPERATIONS TO NONVOLATILE MEMORY USING FSINFO SECTOR MANIPULATION

CROSS REFERENCE TO RELATED APPLICATION

This application is a continuation-in-part of my prior U.S. patent application Ser. No. 09/620,544 now U.S. Pat. No. 6,978,342, entitled "Moving Sectors Within A Block of Information In A Flash Memory Mass Storage Architecture" filed Jul. 21, 2000 and issued on Dec. 20, 2005, which is a continuation of U.S. patent application Ser. No. 09/264,340, now U.S. Pat. No. 6,145,051, filed on Mar. 8, 1999 issued on Nov. 7, 2000 and entitled "Moving Sectors Within A Block of Information In A Flash Memory Mass Storage Architecture", which is a continuation of a prior application Ser. No. 08/831,266, filed on Mar. 31, 1997, now U.S. Pat. No. 5,907,856, issued on May 25, 1999, entitled "Moving Sectors Within A Block of Information In A Flash Memory Mass Storage Architecture," which is a continuation-in-part of prior application Ser. No. 08/509,706, filed Jul. 31, 1995, now U.S. Pat. No. 5,845,313, issued on Dec. 1, 1998, entitled "Direct Logical Block Addressing Flash Memory Mass Storage Architecture." U.S. Pat. Nos. 5,907,856 and 5,845,313 are incorporated herein by reference.

BACKGROUND OF THE INVENTION

1. Field of the Invention

The present invention relates generally to a method and apparatus for decreasing the speed of write operations in systems utilizing nonvolatile memory and particularly to decreasing the speed of write operations in such systems when performing random write operations.

2. Description of the Prior Art

With the advent of the digital information revolution, nonvolatile memory (or FLASH memory or EEPROM memory) has enjoyed considerable popularity within less than a decade. This is in large part due to the particular characteristics, known to those of ordinary skill in the art, attributed to nonvolatile memory, such as maintenance of information even when power is interrupted or disconnected.

Nonvolatile memory has a wide variety of utilization, some of which include digital cameras where they are used to store photographs, in digital format, for later editing or loading elsewhere and personal computers (PCs) where they are used to store various types of digital information.

One of the problems posing a constant challenge to those interested in using nonvolatile memory is known to be the speed of read and write operations. As after each write operation, which involves changing the state of only cells that are still at a logical one state, an erase operation is necessary prior to a subsequent write operation to the same location, it is clear that any improvements to the speed of a write operation proves to be an impressive improvement to the overall system performance.

By way of a brief background to the way in which information is organized within nonvolatile memory, the memory, which may be one or more integrated circuits, typically more than one, is prearranged into blocks with each block including a predetermined number of sectors and each sector including a predetermined number of bytes. A sector is identified by the system by a logical block address (LBA) but when it is to be written to or read from nonvolatile memory, it is identified by a physical block address (PBA). There is generally a known correspondence between LBAs and PBAs, which may be maintained in random access memory (RAM).

An individual block or an individual sector may be defined as an erasable unit depending on the user. For example, a sector might and typically does include 512 bytes of data and 16 bytes of overhead information and in a given application, during an erase operation, the entire sector may be erased, which include many cells. In fact, a number of sectors may be erased at a time, in which case, the user has probably designed the system so that one or more blocks are erased together.

In existing systems employing nonvolatile memory, two types of data are stored therein. One type is file system data, another type is user system data. File system data provides information to the operating system as to the location in which a file, which includes user data, is located. User system data is the contents of a file, each file is generally comprised of large blocks of data typically requiring sequential write operations. In sequential write operations, LBAs appear in sequential order, i.e. sequential sectors are being written thereto.

Write operations are generally initiated by a host that interacts with a controller to direct information in and out of the memory. Sectors, identified by the host, are written thereto in memory. In mass storage applications, the host may initiate two types of write operation, one is a sequential write operation, as discussed hereinabove, and the other is a random write operation. One method of random write operation is generally performed when updating file system data.

In the more recent Windows operating system, employed in most PCs and workstations, a new file system, referred to as "FAT32" (File Allocation Table 32) is utilized, which allows file systems of the size greater than 2 Gigabytes. Advantages allowed by using FAT32 include formatting cards used for various applications, such as digital cameras, that have much larger capacity than prior file systems would have allowed.

In FAT32 type file systems, a special sector, referred to as "FSInfo" (File System Information) is employed. The FSInfo sector is continuously updated with information regarding the location of the next free cluster. In effect, this saves the file system software (operating system) from having to search the FAT for the location of a free cluster, which can be a time-consuming task. Not only FSInfo sectors but certain types of sectors as well, are generally written or re-written thereto more often than types of sectors.

However, continuous writing or updating of these certain sectors that are written thereto more often than others has the side effect of slowing down the system performance, in general, as well as consuming much nonvolatile memory space thereby causing inefficiencies in the use of nonvolatile memory.

As stated above, nonvolatile memory is organized into sectors with a group of sectors comprising a block. A sector typically includes 512 bytes of user data and 16 bytes of overhead information and a block may include 256 sectors, although, a sector may have a different number of bytes and a block may have a different number of sectors.

In existing nonvolatile memory systems, when a sector is to be written thereto, a free block is first located. A logical block address (LBA) value is correlated with a new physical block address (PBA) addressing a free or available block in nonvolatile memory. At this point, the free found block is considered to be 'open' or 'pending', i.e. being written thereto with sector information. For the purposes of discussion, the free found block, having an 'open' or 'pending' status, will be referred to as block 0, identified by VLBA 0.

Next, a sector subsequent to that being written is examined and if it is found that the subsequent sector is sequential or belongs to the correlated VLBA block, i.e. block 0 (PBA 0), the sector information is written to the sector location within the same block. Succeeding sectors of information, which belong to the correlated VLBA block, i.e. block 0, continue to be written thereto until block 0 is no longer free and has no more free locations in which case a different free block, for example, block 10 identified by VLBA 10 (PBA 10), is designated to be written thereto. Now, if there are further writes or updates of an already written sector of block 0, they will be written or stored in block 10. In this case, all of the sector information that was not updated is moved from block 0 to block 10 and block 0 is 'closed' pending erasure thereof.

In the previous example, after block 0 is no longer free, and assuming the new write command has sector information, which belongs to the same VLBA block, i.e. block 0, and is now being updated, a different free block, for example, block 10, identified by VLBA 0 and VPBA 10, is designated to be written thereto and is thus used to store updated sector information. At this point, blocks 0 and 10 are 'pending' or 'open'. If yet another write command is received commanding updating of sector information that does not belong to block 0 and thus corresponds to an LBA other than VLBA 0, yet another free block, i.e. block 20 identified by VLBA 1 and VPBA 20 is used to store such update. An example of sector information that does not belong to the same VLBA block would be non-sequential sectors relative to those sectors being stored in block 0 or block 10. In this example, if block 0 and therefore block 10 are each designated to store sectors 0-255 (LBA 0 . . . LBA 255), then a write to sector 614 (LBA 614) is considered a write to a sector that does not belong to the same VLBA block as that of block 0 or block 10. All of the sector information that was not updated however is moved from block 0 to block 10. Now, in this case, blocks 10 and 20 will be 'open' or 'pending' and block 0 will be 'closed'. As explained in U.S. patent application Ser. No. 09/620,544, entitled "Moving Sectors Within A Block of Information In A Flash Memory Mass Storage Architecture" and filed on Jul. 21, 2000, and U.S. Pat. No. 5,845,313, entitled "Direct Logical Block Addressing Flash Memory Mass Storage Architecture," and issued on Dec. 1, 1998.

Still using the same example as above, yet another scenario is the case where even prior to block 0 running out of free space, that is, while it remains free or has available sector locations, if the new write command is a write operation to one of the sectors that was already updated once, again, another block, such as block 10, is used to store the second update of the already once-updated sector information and subsequent sectors, to the extent they are in sequential order and/or belong to the same LBA group as that of block 0, are written to corresponding sector locations of block 10. Unupdated sectors of block 0 are eventually moved to block 10 and block 0 is 'closed', Block 10 remains 'open' or 'pending'.

To this end, in the case where a block includes, for example, 256 sectors, a maximum of possible 255 move operations of sector information would have to be performed, which is quite time consuming and degrades system performance.

This is illustrated, in high-level block diagram form, in FIG. 1, where a nonvolatile memory system 10 is shown to include a block 12 for storing sector information. The block 12 is initially free and subsequently filled with sector information if and to the extent to which these sectors are sequential. Once a non-sequential sector is to be written, the sectors, with block 12, which include recent or 'good' information, are moved to the block 14, as shown by the arrow 16, which could be 255 move operations (read of 255 sectors from the old or previous block and write of the same to the new block). The move operation of the good or un-updated sectors of the previous block to the new block, are known to cause a 50% slower system performance in nonvolatile memory system.

Thus, the need arises for a system and method for minimizing the time required for performing writing operations of non-sequential sectors in the file system area of nonvolatile memory.

SUMMARY OF THE INVENTION

Briefly, an embodiment of the present invention includes a digital equipment system having a host for sending random write commands to write files having sector information and having a controller device responsive to the commands for writing and updating FSInfo sector information. The controller controls a nonvolatile memory system (an example of nonvolatile memory is flash memory, as well known to those of ordinary skill in the art) organized into blocks, each block including a plurality of sector locations for storing sector information, a particular free block, designated for storing FSInfo sector information. Upon updating of the FSInfo sector, the updated FSInfo sector information is written to a next free sector of the dedicated block thereby avoiding moving the sectors of the particular block to another block, hence, improving system performance.

The foregoing and other objects, features and advantages of the present invention will be apparent from the following detailed description of the preferred embodiments which make reference to several figures of the drawing.

IN THE DRAWINGS

FIG. 2(*a*) shows another embodiment of the present invention.

FIG. 2(*b*) shows the management of frequently accessed sectors by the nonvolatile memory system 20.

DETAILED DESCRIPTION OF THE PREFERRED EMBODIMENTS

Figure 1:
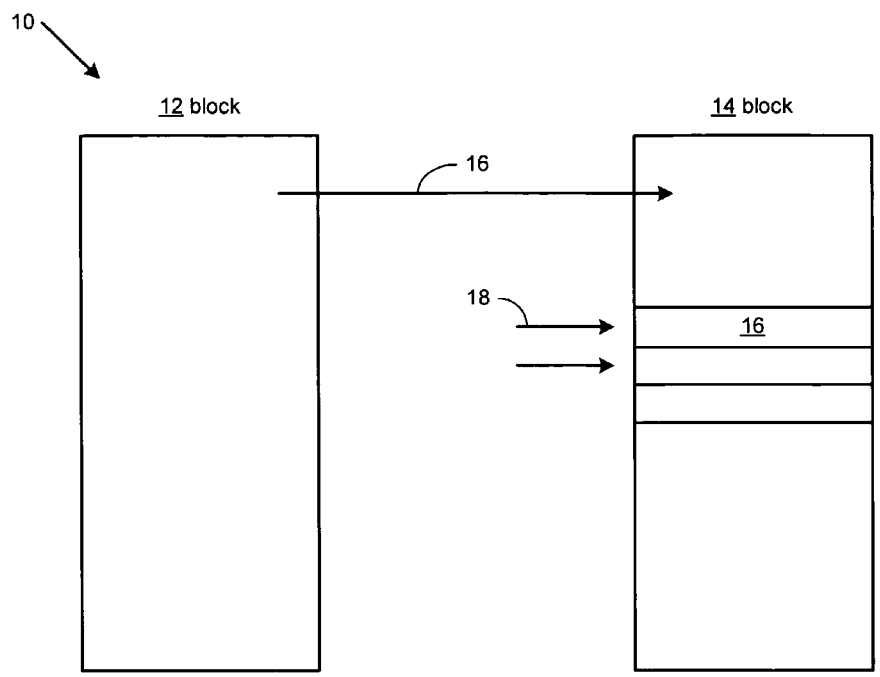
FIG. 1 shows a prior art nonvolatile memory system 10.
Figure 2:
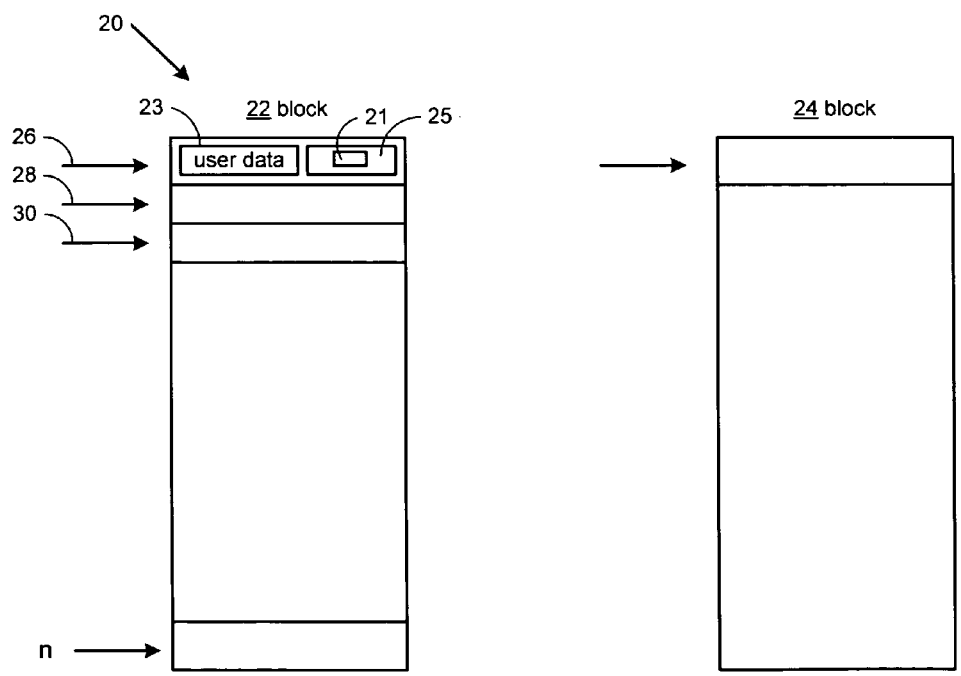
FIG. 2 illustrates a digital equipment system 50 in accordance with an embodiment of the present invention.
Figure 2A:
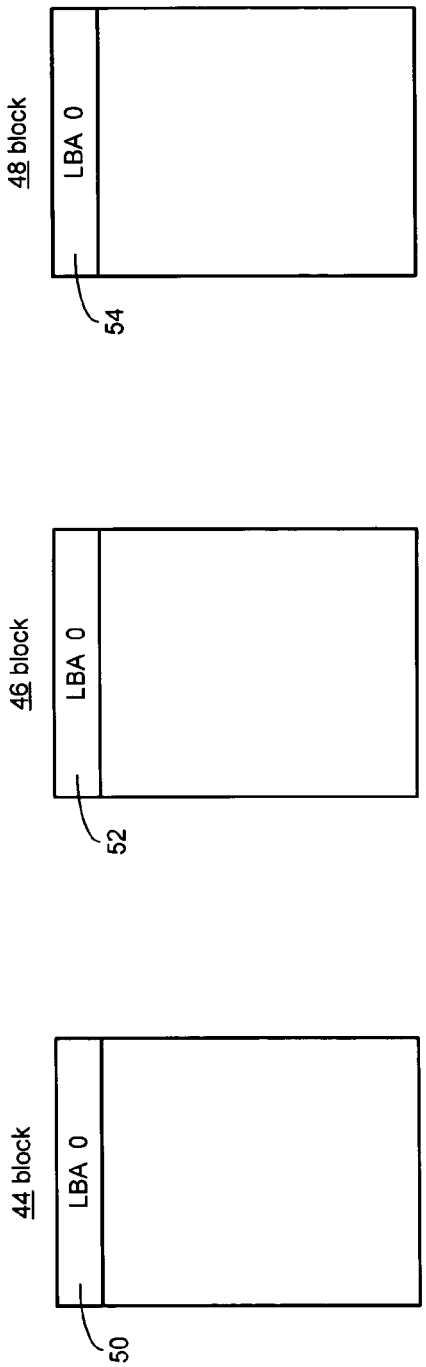

Referring now to FIG. 2, a nonvolatile memory system 20 is shown to include a previous block 22 and a free block 24, in accordance with an embodiment of the present invention. The nonvolatile memory system 20 is comprised of nonvolatile memory storage locations that are organized into blocks with each block including a group of sector locations for storing sector information. Sector information is generally comprised of user data and overhead data. User data is data that is intended to be stored by a user, such as photographs, music and the like, and overhead data is information relating to the user data, such as its location and/or error information and so forth. Various types of sector information are known to those of ordinary skill in the art, one of which is FSInfo sector.

The previous block 22 is dedicated to storing a particular type of sector, namely, a sector that is accessed more frequently than others. This type of sector is detected by using a predetermined threshold for the number of times a sector is accessed and if the number of times a sector is accessed exceeds the threshold, then, it will be treated differently, as discussed hereinbelow. The threshold value is programmed as a fixed value and used by the firmware or software that is directing the operation of the nonvolatile memory system, within the controller. In one embodiment of the present invention, an access counter is used to maintain track of the number of times a sector is accessed.

Figure 3:
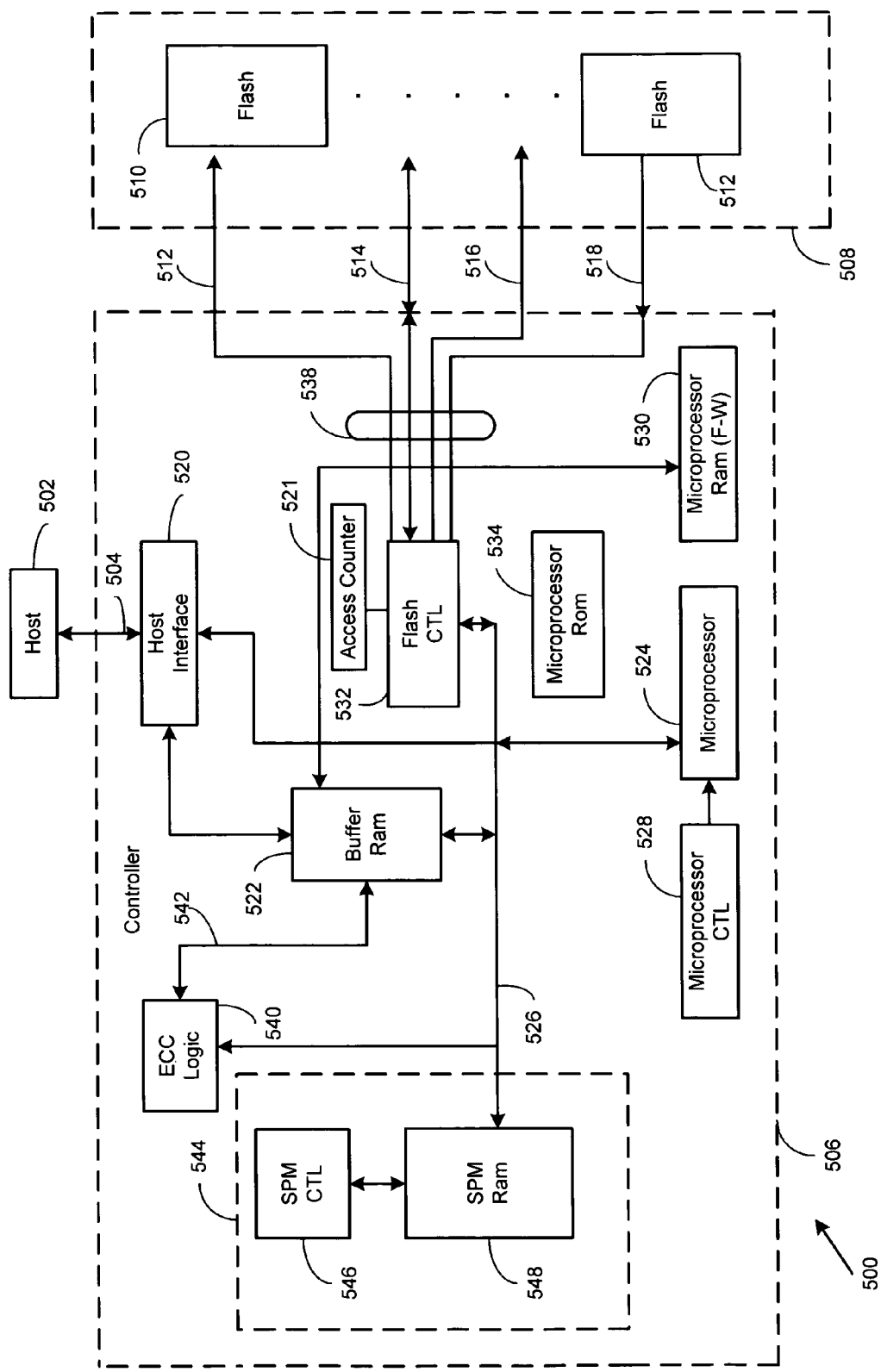
FIG. 3 shows a high-level block diagram of a digital system 500, such as a digital camera, employing the nonvolatile memory system 20 of FIG. 2, in accordance with an embodiment of the present invention.

An example of an access counter value 21 is shown in FIG. 2, within the overhead portion 25 the first sector of the block 22. This sector is also shown to include a user data portion 23. The access counter is physically located within the controller controlling the nonvolatile memory, an example of which is shown by the access counter 521, in FIG. 3, shown coupled to the flash controller block 532. Alternatively, the access counter may be located outside of the controller.

Another way of identifying these types of sectors is by a comparison of the number of times are accessed relative to each other and if sectors are detected that are in the category of being accesses more so than others, they are treated special, as noted below. In both of these methods, a counter, i.e. the access counter, is used to count each time a sector is accessed; the counter value for each sector is generally stored in the overhead portion of the sector information in nonvolatile memory in one example embodiment.

In one method of the present invention, such as the example of FAT 32, system traffic is analyzed and a sector that is accessed more often than other sectors, such as the FSInfo sector is detected as a frequently-accessed sector or if the sector, which belongs to a VLBA block and is accessed repeatedly during writing a file. The FSInfo sector is an example of such a sector. While the discussion below is mostly regarding the FSInfo sector, it should be noted that the present invention applies to whatever kind of sector is accessed more frequently than others and is not limited to the FSInfo sector and that the latter is merely an example embodiment of the present invention. While a discussion of the FSInfo sector is provided hereinabove, a part of the same, namely the function of the FSInfo sector, is repeated.

In FAT32 type file systems, a special sector, referred to as "FSInfo" is employed. The FSInfo sector is continuously updated with information regarding the location of the last known free cluster. In effect, this saves the file system software (operating system) from having to search the FAT for the location of a free cluster, which can be a time-consuming task.

As noted above, FSInfo sector is merely an example of a sector that is frequently accessed. The present invention applies to any type of sector that is detected or known to be accessed more frequently than other sectors and that may cause an unnecessary move if all of the data is not being updated and belongs to the same VLBA block. At any given time, one of the locations of the block 22 stores a current version of the FSInfo sector. For example, the first version of the FSInfo sector might be stored at location 26 of the block 22 and when the FSInfo sector is updated, the updated version may be stored at location 28 and still the following version of the FSInfo sector may be stored at location 30 of the block 22 and so on and so forth until all of the locations of the block 22 are written thereto with various versions of the FSInfo sector with the most recent version being stored at location 'n' of block 22 with 'n' being an integer, such as 256 in the case where there are 256 sectors per block. Thus, every time the FSInfo sector is updated, it is written to a new (or next although it need not be the next location) sector location within the block 22 and the previous sector location is designated as being 'old'. This designation is so that upon a read operation, the most recent version of the FSInfo sector can be easily identified. That is, the sector location, which includes the most recent version of the FSInfo sector will have a designation other than 'old', whereas, all sector locations, which include a previous version of the FSInfo sector will have a designation of 'old'. There are other ways of identifying the most recent version of FSInfo sector, one way is to keep track of the LBA value identifying the sector location, which includes the most recent version of FSInfo sector.

Once the block 22 is full, that is, all of its sector locations are written thereto with various versions of the FSInfo sector, the block 24 is written thereto and the block 22 is ready to be erased and an 'old' designation of the same is made. Again, with respect to block 24, as with block 22, the FSInfo sector is written to a sector location thereof each time the FSInfo sector is updated. To reiterate, the updating of the FSInfo sector in prior art techniques, as noted hereinabove, required moving the 'good' sectors of the previous block to another block (or read and written) resulting in time-consuming operations, i.e. many read and write operations, that need not occur in the present invention.

In the present invention, there is no moving of all of the 'good' sectors of a block to another block when the FSInfo sector is updated, accordingly, there is no need to move, for example, 255 sectors from the block 22 to the block 24, as there would have been in prior art systems.

In the embodiment of FIG. 2, the next free sector location within the same block 22 is used to store the updated or most recent version of FSInfo sector rather than a sector within a new block.

In the present invention, each time FSInfo sector is updated, a write operation occurs. In the present invention, there is no requirement to move, i.e. read and write, the sectors of the block 22 to the block 24. The block 22 is dedicated to storing no other type of sectors other than the FSInfo sector. Upon completion of writing to all of the sector locations of the block 22 and upon receiving the next update of the FSInfo sector and storing the same in a new block, the block 22 is erased.

In another embodiment of the present invention, more than one sector is treated differently, in that, there are more than one type of sectors that are accessed much more often than others and are thus dedicated, at all times, a block. This is perhaps best understood using an example.

Assuming that sectors, identified by LBA 0 and LBA 50, are accessed much more frequently than others, every time LBA 0 is written, it will be written to a particular block within the nonvolatile memory and following the same, when LBA 50 is written, it is also written to the particular block and then again, when LBA 0 is re-written, rather than being written to a different block, as done by the prior art, it is written to the particular block (perhaps the third location, as the first two locations are occupied by the first writes to the LBA 0 and LBA 50). Next, upon a re-write of sector 50, it too is written to the particular block and so forth and so on until all of the sector locations of the particular are written thereto. Afterwards, a different block is dedicated to which following re-writes of LBA 0 and LBA 50 are made and the particular block is erased.

An alternative embodiment of the present invention includes writing the particular sector recognized to be accessed more often than other sectors to a different block every time it is written, as opposed to the same dedicated block.

An example of such an embodiment is shown in FIG. 2(*a*) where blocks 44, 46 and 48 are designated as blocks accommodating special sectors that are accessed more frequently than others. In this case, as an example, sector information identified by LBA 0 is accessed frequently and every time it is written, it is written to a different block. The first time it is being written, it is written to the sector location 50 of block 44, the second time it is being written, it is written to the location 52 of block 46 and so on and so forth, such as another writing of the same to location 54 of block 48. This avoids any move operations and thereby increases system performance. The drawback is that if done with many blocks, i.e. the number of blocks such as 44, 46 and 48 to which the LBA 0 sector information is written is numerous, many blocks are left 'open' or are written thereto and thus can not be used to write other kinds of information until at some point, they are 'closed' or declared of no further use and erased before being used again.

Figure 2B:
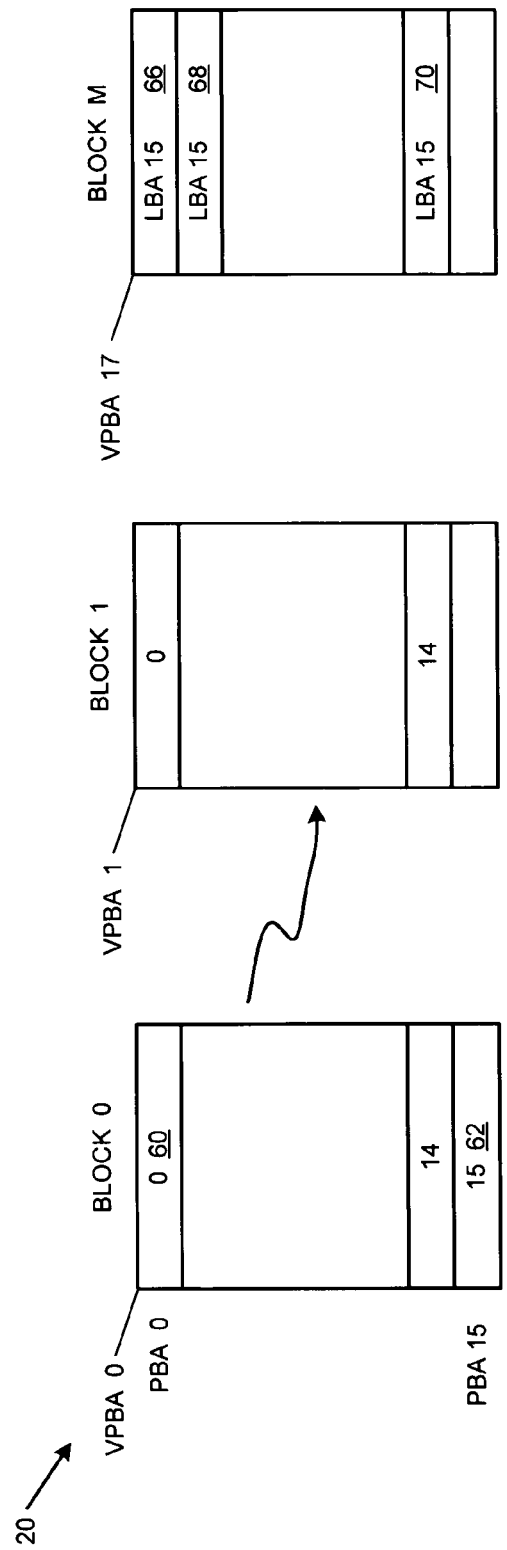

FIG. 2(b) shows the management of frequently accessed sectors by the nonvolatile memory system 20. The system 20, in FIG. 2(b), is shown to include a block 0, a block 1 and a block M, while many blocks may be employed, blocks 0, 1 and M are shown for illustrative purposes.

Each block includes a predetermined number of sector storage locations, such as 16, each for storing sector information, i.e. user data and overhead information. Block 0 is identified or addressed by VPBA 0, block 1 is identified by VPBA 1 and block M is identified by VPBA 17, by way of example. Each of the sector storage locations is identified by a particular PBA. For example, the first sector storage location 60 of block 0 is identified by a PBA 0 and the last sector storage location 62 of block 0 is identified or addressed by PBA 15. While not shown, the remaining blocks of FIG. 2(b) include similar PBA addressing of their respective sector storage locations.

In the example of FIG. 2(b), LBA 15 is chosen for frequently accessing thereof by the host and will thus be the main target of this discussion. It should be noted that any other sector may be designated as a frequently-accessed sector, as discussed hereinabove. Block M serves as a dedicated block for storing updates to the sector identified by LBA 15, referred to at times, as sector 15.

First, sectors are written to the sector storage locations of block 0. Upon a re-write of these sectors, they are written to the sectors of block 1 with the exception of sector 15, or that sector identified by LBA 15. That is, rather than writing sector 15 to block 1, it is written to the dedicated block, block M, in this case, as are subsequent updates to sector 15. Thus, every time sector 15 is updated either as part of a sequential number of sectors, i.e. sectors 0-15, or otherwise, such as in a random write operation, it is written to an unused or available sector location within the block M. The first time it is updated, it may be written to the sector location 66, the next time it is updated it may be written to the sector location 68 and so on until it is written to the sector location 70. Thereafter, another available block is allocated to include updates of sector 15.

FIG. 3 depicts a digital system 500 such as a digital camera, personal computer, or the like, employing an embodiment of the present invention. Digital system 500 is illustrated to include a host 502, which may be a personal computer (PC) or simply a processor of any generic type commonly employed in digital systems, coupled to a controller circuit 506 for storing in and retrieving information from nonvolatile memory unit 508. In one embodiment of the present invention, the memory unit 508 includes the nonvolatile memory system 20 of FIG. 2 and is managed similarly to that which is described with respect to preceding figures hereinabove.

The controller circuit 506 may be a semiconductor (otherwise referred to as an "integrated circuit" or "chip") or optionally a combination of various electronic components. In the preferred embodiment, the controller circuit is depicted as a single chip device. The nonvolatile memory unit 508 is comprised of one or more memory devices, which may each, be flash or EEPROM types of memory. In the preferred embodiment of FIG. 3, memory unit 508 includes a plurality of flash memory devices, 510-512, each flash device includes individually addressable locations for storing information. In the preferred application of the embodiment in FIG. 3, such information is organized in blocks with each block having one or more sectors of data. In addition to the data, the information being stored may further include status information regarding the data blocks, such as flag fields, address information and the like.

The host 502 is coupled through host information signals 504 to a controller circuit 506. The host information signals comprise of address and data busses and control signals for communicating command, data and other types of information to the controller circuit 506, which in turn stores such information in memory unit 508 through flash address bus 512, flash data bus 514, flash signals 516 and flash status signals 518 (508 and 512-516 collectively referred to as signals 538). The signals 538 may provide command, data and status information between the controller 506 and the memory unit 508.

The controller 506 is shown to include high-level functional blocks such as a host interface block 520, a buffer RAM block 522, a flash controller block 532, a microprocessor block 524, a microprocessor controller block 528, a microprocessor storage block 530, a microprocessor ROM block 534, an ECC logic block 540 and a space manager block 544. The host interface block 520 receives host information signals 504 for providing data and status information from buffer RAM block 522 and microprocessor block 524 to the host 502 through host information signals 504. The host interface block 520 is coupled to the microprocessor block 524 through the microprocessor information signals 526, which is comprised of an address bus, a data bus and control signals.

The microprocessor block 524 is shown coupled to a microprocessor controller block 528, a microprocessor storage block 530 and a microprocessor ROM block 534, and serves to direct operations of the various functional blocks shown in FIG. 3 within the controller 506 by executing program instructions stored in the microprocessor storage block 530 and the microprocessor ROM block 534. Microprocessor 524 may, at times, execute program instructions (or code) from microprocessor ROM block 534, which is a nonvolatile storage area. On the other hand, microprocessor storage block 530 may be either volatile, i.e., read-and-write memory (RAM), or nonvolatile, i.e., EEPROM, type of memory storage. The instructions executed by the microprocessor block 524, collectively referred to as program code, are stored in the storage block 530 at some time prior to the beginning of the operation of the system of the present invention. Initially, and prior to the execution of program code from the microprocessor storage location 530, the program code may be stored in the memory unit 508 and later downloaded to the storage block 530 through the signals 538. During this initialization, the microprocessor block 524 can execute instructions from the ROM block 534.

Controller 506 further includes a flash controller block 532 coupled to the microprocessor block 524 through the microprocessor information signals 526 for providing and receiving information from and to the memory unit under the direction of the microprocessor. Information such as data may be provided from flash controller block 532 to the buffer RAM block 522 for storage (may be only temporary storage) therein through the microprocessor signals 526. Similarly, through the microprocessor signals 526, data may be retrieved from the buffer RAM block 522 by the flash controller block 532.

ECC logic block 540 is coupled to buffer RAM block 522 through signals 542 and further coupled to the microprocessor block 524 through microprocessor signals 526. ECC logic block 540 includes circuitry for generally performing error coding and correction functions. It should be understood by those skilled in the art that various ECC apparatus and algorithms are commercially available and may be employed to perform the functions required of ECC logic block 540. Briefly, these functions include appending code that is for all intensive purposes uniquely generated from a polynomial to the data being transmitted and when data is received, using the same polynomial to generate another code from the received data for detecting and potentially correcting a predetermined number of errors that may have corrupted the data. ECC logic block 540 performs error detection and/or correction operations on data stored in the memory unit 508 or data received from the host 502.

The space manager block 544 employs a preferred apparatus and algorithm for finding the next unused (or free) storage block within one of the flash memory devices for storing a block of information, as will be further explained herein with reference to other figures. As earlier discussed, the address of a block within one of the flash memory devices is referred to as VPBA, which is determined by the space manager by performing a translation on an LBA received from the host. A variety of apparatus and method may be employed for accomplishing this translation. An example of such a scheme is disclosed in U.S. Pat. No. 5,845,313, entitled "Direct Logical Block Addressing Flash Memory Mass Storage Architecture", the specification of which is herein incorporated by reference. Other LBA to PBA translation methods and apparatus may be likewise employed without departing from the scope and spirit of the present invention.

Space manager block 544 includes SPM RAM block 548 and SPM control block 546, the latter two blocks being coupled together. The SPM RAM block 548 stores the LBA-PBA mapping information (otherwise herein referred to as translation table, mapping table, mapping information, or table) under the control of SPM control block 546. This mapping can be kept also in the non-volatile memory. Alternatively, the SPM RAM block 548 may be located outside of the controller, such as shown in FIG. 3 with respect to RAM array 100.

The RAM memory is arranged to be addressable by the same address as the LBA provided by the host. Each such addressable location in the RAM includes a field which holds the physical address of the data in the nonvolatile mass storage expected by the host.

Ultimately, the way in which a block is addressed in nonvolatile memory is by a virtual logical block address (VLBA), which is a modified LBA, for each block. The way in which a sector is addressed within each block is by the use of a virtual physical block address (VPBA). The VPBA locations are for storing information generally representing a PBA value corresponding to a particular LBA value.

In operation, the host 502 writes and reads information from and to the memory unit 508 during for example, the performance of a read or write operation through the controller 506. In so doing, the host 502 provides an LBA to the controller 506 through the host signals 504. The LBA is received by the host interface block 520. Under the direction of the microprocessor block 524, the LBA is ultimately provided to the space manager block 544 for translation to a PBA and storage thereof, as will be discussed in further detail later.

Under the direction of the microprocessor block 524, data and other information are written into or read from a storage area, identified by the PBA, within one of the flash memory devices 510-512 through the flash controller block 532. The information stored within the flash memory devices may not be overwritten with new information without first being erased, as earlier discussed. On the other hand, erasure of a block of information (every time prior to being written), is a very time and power consuming measure. This is sometimes referred to as erase-before-write operation. The preferred embodiment avoids such an operation by continuously, yet efficiently, moving a sector (or multiple sectors) of information, within a block, that is being re-written from a PBA location within the flash memory to an unused PBA location within the memory unit 508 thereby avoiding frequent erasure operations. A block of information may be comprised of more than one sector such as 16 or 32 sectors. A block of information is further defined to be an individually-erasable unit of information. In the past, prior art systems have moved a block stored within flash memory devices that has been previously written into a free (or unused) location within the flash memory devices. Such systems however, moved an entire block even when only one sector of information within that block was being re-written. In other words, there is waste of both storage capacity within the flash memory as well as waste of time in moving an entire block's contents when less than the total number of sectors within the block are being re-written. The preferred embodiments of the present invention, as discussed herein, allow for "moves" of less than a block of information thereby decreasing the number of move operations of previously-written sectors, consequently, decreasing the number of erase operations.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of operating a nonvolatile memory unit having nonvolatile memory storage locations organized into blocks of nonvolatile memory cells, each block having one or more physical sectors of nonvolatile storage locations that are represented by one or more logical sectors, the method comprising:

designating one or more blocks of nonvolatile memory cells for storing only information corresponding to user system data that is frequently accessed;

counting a number of times a physical sector is accessed by a write command and storing the number of access times in an overhead information portion of a logical sector representative of the physical sector;

designating a logical sector corresponding to user system data as containing user system data that is frequently accessed if the stored number of access times for that designated logical sector indicates that the designated logical sector is being accessed more frequently than other sectors;

writing updated information of the designated logical sector corresponding to user system data that is frequently accessed only to a free physical sector of one of the designated blocks of nonvolatile memory cells until the one of the designated blocks is filled; and writing updated information of a logical sector corresponding to user system data that is not designated as frequently accessed only to a free physical sector of a block of nonvolatile memory cells other than the blocks designated for storing only information corresponding to user system data that is frequently accessed.

2. The method of claim 1, further comprising:
upon filling all of the physical sectors of a designated block, designating a next block only for storing information corresponding user system data that is frequently accessed.

3. The method of claim 2, further comprising:
deeming the filled designated block as old; and
erasing the old designated block after writing information to the next designated block.

4. The method of claim 1, wherein designating one or more blocks for storing information corresponding to user system data that is frequently accessed comprises designating one or more blocks for storing information corresponding to user system data that is frequently accessed and for storing information corresponding to file system data.

5. The method of claim 4, further comprising:
writing information corresponding to file system data to a free physical sector of one of the designated blocks.

6. The method of claim 5, wherein writing information corresponding to file system data or user system data that is frequently accessed only to one of the designated blocks comprises writing such information to a single designated block until that designated block is filled, and writing such information to a next designated block upon filling a prior designated block.

7. The method of claim 5, wherein writing information corresponding to file system data or user system data that is frequently accessed only to one of the designated blocks comprises writing information corresponding to file system data to a first one of the designated blocks and writing information corresponding to user system data that is frequently accessed to a second one of the designated blocks.

8. The method of claim 1, wherein designating a logical sector corresponding to user system data as containing user system data that is frequently accessed if a number of access times for that logical sector exceeds a threshold value comprises designating a logical sector corresponding to user system data as containing user system data that is frequently accessed if a number of access times for that logical sector relative to a number of access times for other logical sectors exceeds a threshold value.

9. The method of claim 1, wherein counting a number of times a logical sector is accessed comprises counting within a controller that is configured to direct the writing of the information to the blocks.

10. The method of claim 1, wherein writing information of a logical sector to a free physical sector of a block comprises also writing to the free physical sector a value of the number of access times for that logical sector.

11. A method for operating a nonvolatile memory unit, the method comprising:
designating a memory block of the nonvolatile memory unit for storing only information corresponding to frequently accessed system data;
counting a number of access times a sector of the nonvolatile memory unit is accessed by a write command and storing the number of access times in an overhead information portion of the sector;
designating a first sector of the designated memory block as containing the frequently accessed system data if the stored number of access times for the first sector indicates that the first sector is being accessed more frequently than other sectors of the nonvolatile memory unit;
writing updated information of the first sector corresponding to the frequently accessed system data to only a free sector of the designated memory block until the designated memory block is filled; and
writing updated information of other sectors of the nonvolatile memory unit corresponding to user system data that is not designated as frequently accessed to only a free sector of a memory block of the nonvolatile memory unit other than the designated memory block.

12. The method of claim 11 wherein designating a first sector of the designated memory block as containing frequently accessed system data further comprises designating a first sector by determining if the stored number of access times exceeds a threshold value stored in a controller that is coupled to the blocks of nonvolatile memory cells.

13. The method of claim 12 wherein determining the designated sector corresponding to system data as containing the frequently accessed system data if the stored access count for the first designated sector indicates that the first designated sector is being accessed more frequently than other sectors of the memory unit is performed by the controller determining a number of times a sector is accessed relative to other sectors of the memory unit.

* * * * *